US011018174B2

(12) United States Patent
Wright

(10) Patent No.: US 11,018,174 B2
(45) Date of Patent: May 25, 2021

(54) APPARATUS AND METHOD RELATED TO SENSOR DIE ESD PROTECTION

(71) Applicant: SEMICONDUCTOR COMPONENTS INDUSTRIES, LLC, Phoenix, AZ (US)

(72) Inventor: Peter Wright, Sunnyvale, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 688 days.

(21) Appl. No.: 15/876,328

(22) Filed: Jan. 22, 2018

(65) Prior Publication Data

US 2019/0229143 A1 Jul. 25, 2019

(51) Int. Cl.
*H01L 27/146* (2006.01)
*H01L 23/00* (2006.01)
*H01L 27/02* (2006.01)

(52) U.S. Cl.
CPC ........ *H01L 27/14636* (2013.01); *H01L 24/05* (2013.01); *H01L 27/0288* (2013.01); *H01L 27/0292* (2013.01); *H01L 27/14607* (2013.01); *H01L 27/14623* (2013.01); *H01L 27/14643* (2013.01); *H01L 24/06* (2013.01); *H01L 2224/05025* (2013.01); *H01L 2224/0557* (2013.01); *H01L 2224/05554* (2013.01); *H01L 2224/06131* (2013.01); *H01L 2224/06135* (2013.01); *H01L 2224/06137* (2013.01); *H01L 2924/00014* (2013.01)

(58) Field of Classification Search
CPC .. H02H 27/0248–0296; H02H 27/146–14893; H02H 9/04–046; H01L 27/14623; H01L 27/14636; H01L 27/0248–0296; H01L 9/04–046
See application file for complete search history.

(56) References Cited

U.S. PATENT DOCUMENTS

| | | | |
|---|---|---|---|
| 2005/0093071 A1 | 5/2005 | Wu | |
| 2015/0303233 A1* | 10/2015 | Borthakur | H01L 27/14634 348/273 |
| 2016/0240574 A1* | 8/2016 | Tsai | H01L 27/14634 |
| 2020/0227455 A1* | 7/2020 | Lee | H01L 27/14636 |

* cited by examiner

*Primary Examiner* — Jared Fureman
*Assistant Examiner* — Christopher J Clark
(74) *Attorney, Agent, or Firm* — Brake Hughes Bellermann LLP

(57) ABSTRACT

Techniques of drawing ESD current away from an image sensor device of a CMOS image sensor die include using a light shield configured to block light from an image sensor device. The light shield may be used to draw the ESD current away when it has an electrical connection to an ESD ground bus and/or to a bond pad of the CMOS image sensor die. Advantageously, the light shield has a low resistance due to its large surface area. Accordingly, parallel connections to the bond pads and/or ESD bus have a resistance close to the low resistance of the light shield without altering the size of the die.

18 Claims, 4 Drawing Sheets

APPARATUS AND METHOD RELATED TO SENSOR DIE ESD PROTECTION

TECHNICAL FIELD

This description relates to decreasing electrostatic discharge (ESD) bus resistance in sensor die.

BACKGROUND

Some sensor arrays use electrostatic discharge (ESD) buses to direct ESD current to ground in order to protect the image sensor and other devices on a die from damage from that current. Conventional ESD buses in an image sensor array achieve a low resistance using a relatively wide metal bus. The conventional ESD buses result in, for example, a high per die cost because the wide bus increases the die size leading to fewer die available per wafer.

SUMMARY

In one general aspect, an apparatus includes a substrate; a metal layer disposed on the substrate; a silicon layer disposed on the metal layer, the silicon layer including an image sensor device; an dielectric layer disposed on the metal layer; and a shield layer disposed on the dielectric layer, the shield layer including a light shield; the bond pad having an electrical connection to the metal layer, the light shield being configured to block light from being detected by the image sensor device, the light shield having an electrical connection to the bond pad.

The details of one or more implementations are set forth in the accompanying drawings and the description below. Other features will be apparent from the description and drawings, and from the claims.

DETAILED DESCRIPTION

This description relates to decreasing electrostatic discharge (ESD) in sensor die. In some implementations, problems associated with ESD within the sensor die can be reduced by, for example, decreasing bus resistance in the sensor die. In some implementations, improved methods and apparatus described herein can include for example drawing ESD current away from an image sensor device of an image sensor die. In some implementations, current can be drawn away from the image sensor using a light shield configured to block light from an image sensor device. The light shield may be used to draw the ESD current away when it has an electrical connection to an ESD ground bus and/or to a bond pad of the image sensor die. Advantageously, the light shield can have a relatively low resistance because of the relatively large surface area of the light shield. Accordingly, parallel connections to the bond pads and/or ESD bus can have a resistance close to (e.g., the same as) the low resistance of the light shield without altering the size of the die. In some implementations, the image sensor die can include a complementary metal-on silicon (CMOS) image sensor die.

The resistance of the ESD bus should be relatively low (e.g., less than 1Ω) even for pins of the die that are located far apart (e.g., 5 mm or more). If the resistance is too high, ESD current may get shunted through sensitive areas in the die, (i.e., through devices) that can damage, for example, the gate oxide, and can result in excessive heating in the die. The methods and apparatus describe herein are contrasted from techniques of addressing high ESD bus resistance by adding additional metal layers to an image sensor die. The additional metal levels can add processing steps and/or cost to manufacturing image sensor dies.

Figure 1:
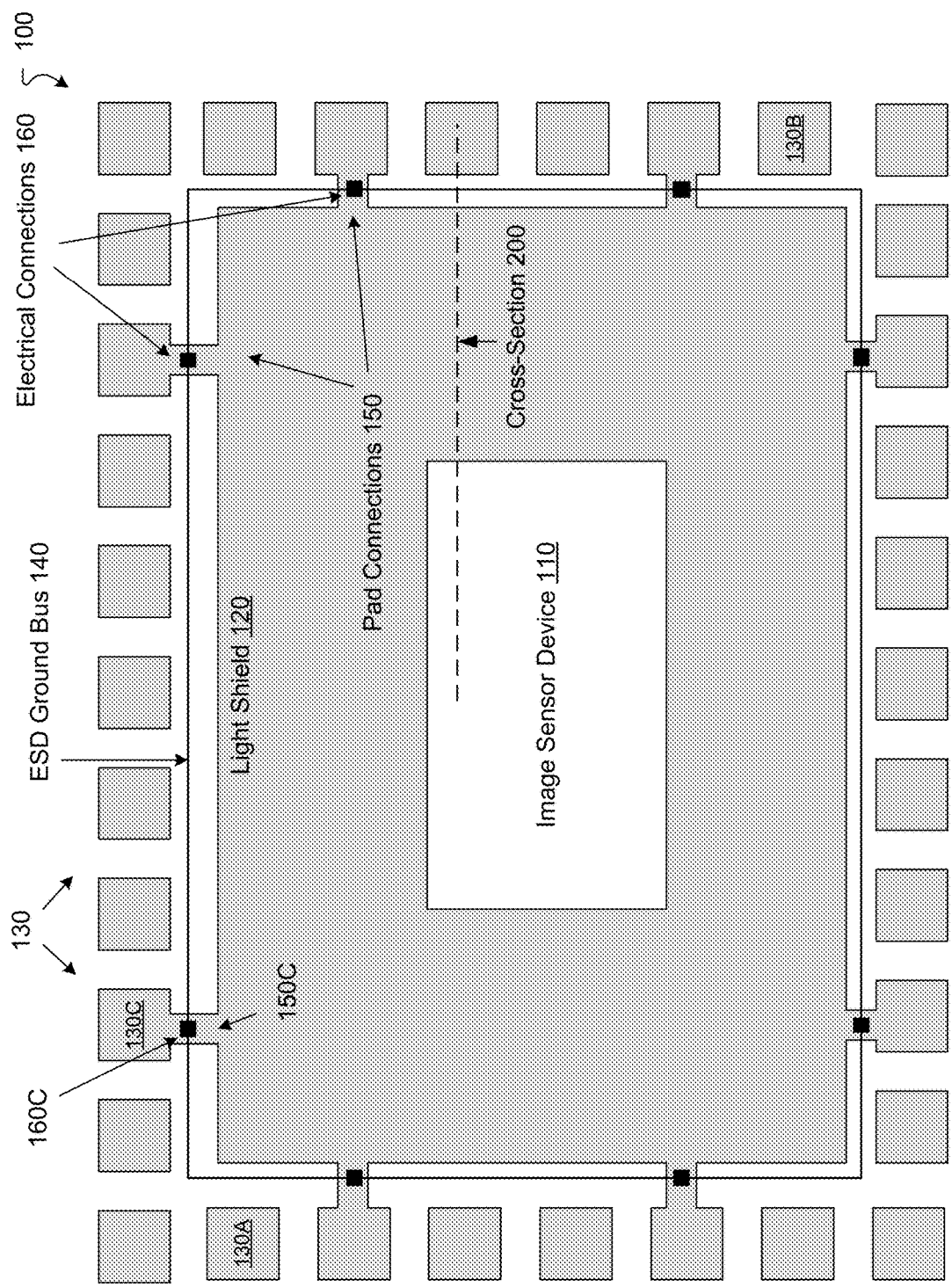
FIG. 1 is a diagram that illustrates a top-down view of an example CMOS image sensor for implementing improved techniques described herein.

FIG. 1 is a diagram that illustrates an example image sensor die 100 (e.g., CMOS sensor die) (also can be referred to as a sensor die). The image sensor die 100 shown in FIG. 1 includes an image sensor device 110, a light shield 120, bond pads 130 (with bond pads 130A through 130C being specifically labeled), an ESD ground bus 140. As shown in FIG. 1, pad connections 150 (with pad connection 150C being specifically labeled) are disposed between the light shield 120 and at least some of the bond pads 130. Also, electrical connections 160 (with electrical connection 160C being labeled) are used to connect the light shield 120 and the ESD ground bus 140 with at least some of the bond pads 130. In some implementations, the electrical connections 160 can be referred to as ESD connections. In some implementations, pad connections 150 can be referred to as bond pad connections. FIG. 1 also shows a cross section 200 of the image sensor die that is described in detail in FIG. 2.

The image sensor device 110 is configured to convert an optical signal that includes light having a range of wavelengths into an electrical signal. For example, digital cameras use such image sensor devices to generate pixels of digital images. In some implementations, the image sensor device 110 is frontlit so that the light incident on the image sensor device 110 originates from the top of a wafer substrate. In some implementations, the image sensor device 110 is backlit so that the light incident on the image sensor device 110 originates from the bottom of the wafer substrate.

The light shield 120 is configured to block light peripheral to the sensor die 100 from being detected by the image sensor device 110. For example, light incident from the periphery of the sensor die 100 directly incident on the image sensor device 110 tends to increase current leakage in the device, leading to inaccurate electrical signal generation. In a digital camera, for example, such an inaccuracy may lead to poor image quality in the exposed pixels.

The bond pad 130C (or any of the bond pads 130 shown in FIG. 1) is configured as an electrical connection between the sensor die 100 and other electrical components using, for example, a printed circuit board (PCB). For example, the bond pad 130C can be or can be associated with a pin by which the electrical connection to the other electrical components can be made. Further, the bond pad 130C can be configured as the electrical connection to an integrated circuit metallization in a metal layer of the sensor die (see FIG. 2).

Because the bond pad 130C can be or can include an electrical connection between the sensor die 100 and external electrical components, ESD events, for example, from a human touching a component electrically coupled to the bond pad 130C, can occur at the bond pad 130C. Accordingly, ESD current generated from this event should be directed from the bond pad 130C and away from the image sensor device 110, which may be damaged by the ESD current.

The ESD ground bus 140 is configured to direct ESD current from the bond pad 130C and away from the image sensor device 110 to protect the image sensor device 110 from the ESD current. In order to ensure that essentially no ESD current damages the image sensor device 110, the ESD ground bus 140 has a low resistance, for example less than 1Ω. In some implementations, the ESD bus 140 can be too narrow to have such a low resistance between bond pads far apart on the Sensor die 100, for example, bond pads 130A and 130B as shown in FIG. 1. Accordingly, for the sensor die 100, the ESD ground bus 140 may not provide sufficient protection to the image sensor device 110 from ESD current.

As shown in FIG. 1, the ESD ground bus 140 is disposed around a perimeter of the light shield 120. The bonds pads 130 are disposed around the perimeter of the ESD ground bus 140. Accordingly, ESD current from any of the bond pads 130 may be shunted away from the image sensor device 110.

In some implementations, the light shield 120 is also configured to direct ESD current away originating from any of the bond pads 130 from the image sensor device 110. In some implementations, the light shield 120 has an electrically conductive material such as aluminum or tungsten that is also opaque to light at the wavelengths detected by the image sensor device 110. In some implementations, the light shield 120 has an electrical connection 160 to the ESD ground bus 140. In some implementations, the electrical connection 160 to the ESD ground bus 140 is a parallel connection. In this way, if the resistance of the light shield 120 is small due to its width, then the net resistance of the ESD bus 140 and light shield 120 will also be small. Specifically, if the resistance of the light shield 120 is less than 50% of the resistance of the ESD ground bus 140, then the net resistance will also be less than 50% of the resistance of the ESD ground bus 140. For example, if the resistance of the ESD ground bus 140 between bond pads 130A and 130B is 10Ω and the resistance of the light shield 120 is 1Ω, then the net resistance will be less than 1Ω. This low resistance is the order of magnitude of resistance sought to protect the image sensor device 110 from ESD current.

In addition to blocking light from the imaging array, the light shield can be connected to the ESD ground in multiple places around the chip in order to lower the ESD ground bus resistance. In some implementations, however, not every bond pad has an electrical connection to the light shield 120. In one example, there may be one bond pad with an electrical connection to the light shield 120 for every two bond pads in the image sensor die. In another example, there may be no bond pads with an electrical connection to the image shield 120. In this case, the image shield 120 has electrical connections to the ESD ground bus 120. In a further example, the image shield 120 only has electrical connections to some of the bond pads and none to the ESD ground bus 140. In some implementations, the pad connection 150C is in addition to the electrical connection 160C.

Figure 2:
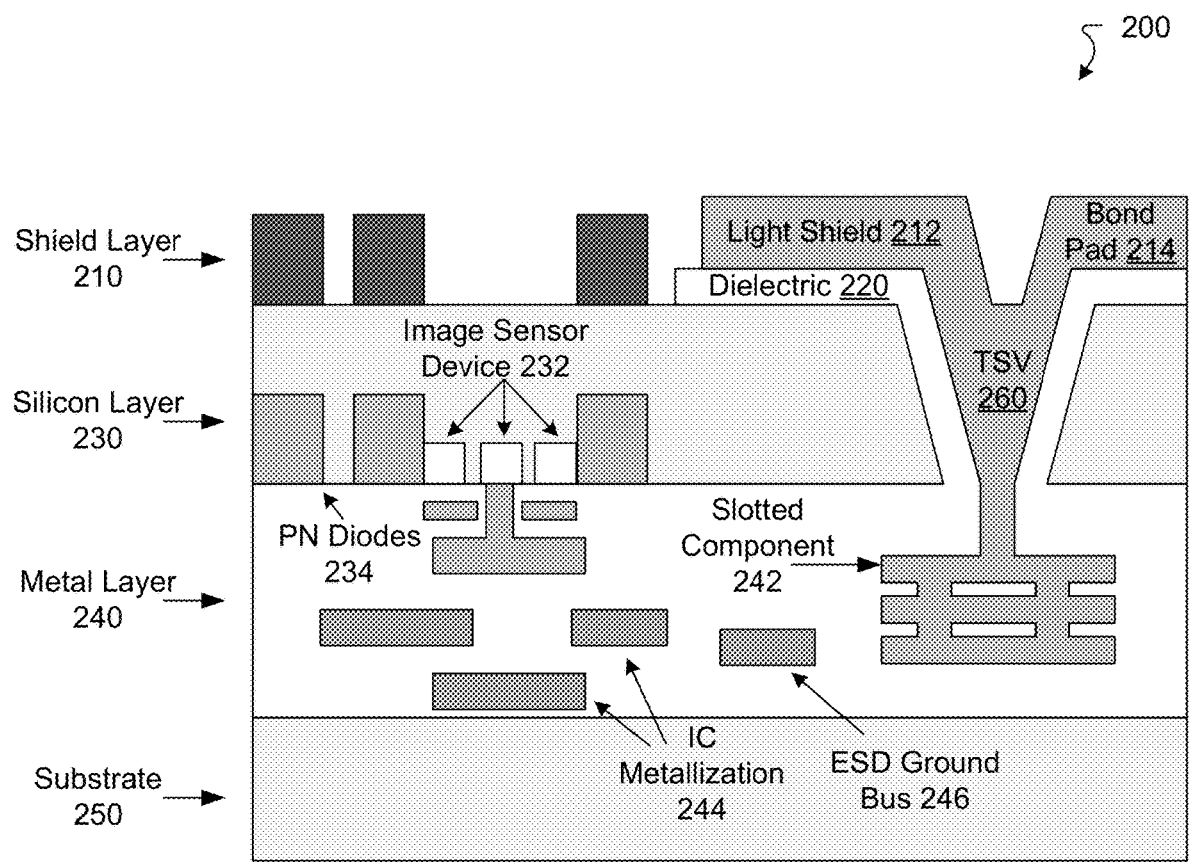
FIG. 2 is a diagram that illustrates a cross-section view of the example CMOS image sensor for implementing improved techniques described herein.

FIG. 2 is a diagram illustrating a cross-sectional view of the cross-section 200 shown in FIG. 1. As shown in FIG. 2, the cross-section 200 includes a substrate 250, a metal layer 240 disposed on the substrate 250, a silicon layer 230 disposed on the metal layer 240, an dielectric layer 220 disposed on the silicon layer 230, and a shield layer 210 disposed on the dielectric layer 220 and the silicon layer 230.

The shield layer 210 of the sensor die 200 includes various devices created at a final stage of semiconductor processing (e.g., planarization, coating, pattern transfer, develop, and etch). It is from the shield layer that the sensor die 200 is exposed to light to be detected by an image sensor device 232. The shield layer 210 includes a light shield 212 and a bond pad 214, each disposed on the dielectric layer 220.

The dielectric layer 220 as shown in FIG. 2 is a dielectric material. In some implementations, the dielectric layer 220 may be a dielectric, insulating material. In some implementations, the dielectric layer 220 can be an oxide layer.

The silicon layer 230 is configured to include the semiconductor material in which the image sensor device 232 and PN diodes 234 may be formed. As shown in FIG. 2, there is about a 2 um gap between the tops of the PN diodes 234 and the top of the silicon layer 230. In some implementations, the silicon layer may be an epitaxial layer.

The metal layer 240 is configured to include the integrated circuit metallization 244 that in turn includes the electrical pathways for activating the image sensor device 232. The metal layer 240 also includes the ESD ground bus 246 and a slotted component 242 to which the light shield 212 and bond pad 214 are electrically connected.

The substrate 250 is a semiconductor wafer onto which the above layers have been processed. In some implementations, the wafer has a backside that is thinned enough to allow for backlit illumination to reach the image sensor device 232.

During processing, semiconductor processing equipment images, develops, and etches a hole in the silicon layer to connect the light shield 212 and bond pad 214 to the metal layer 240. In some implementations, the connection is made using a through-silicon via (TSV) 260. The TSV 260 connects the light shield 212 and the bond pad 214 to each other and the slotted component 242 in the metal layer 240. The TSV 260 and accordingly, the light shield 212 and the bond pad 214 are in turn connected electrically to the ESD ground bus 246 through the metal layer 240. In some implementations, the TSV 260 has a width between 5 um and 10 um. In some implementations, the TSV 260 has a width less than 5 um, e.g., 1 um. In some implementations, the TSV has a width greater than 10 um, e.g., 100 um. In some implementations, the TSV 260 and the slotted component 260 have the same electrically conductive material. The slotted component 242 may then have a lower resistance along the TSV 260 by increasing the effective surface area of the TSV 260.

Ultimately, the image shield 212 is configured to direct, or shunt, ESD current from the bond pad 214 away from the image sensor device 232 to ground. In some implementations, an ESD device (FIG. 3) is configured to identify an input current as an ESD current and direct the ESD current safely to ground.

Figure 3:
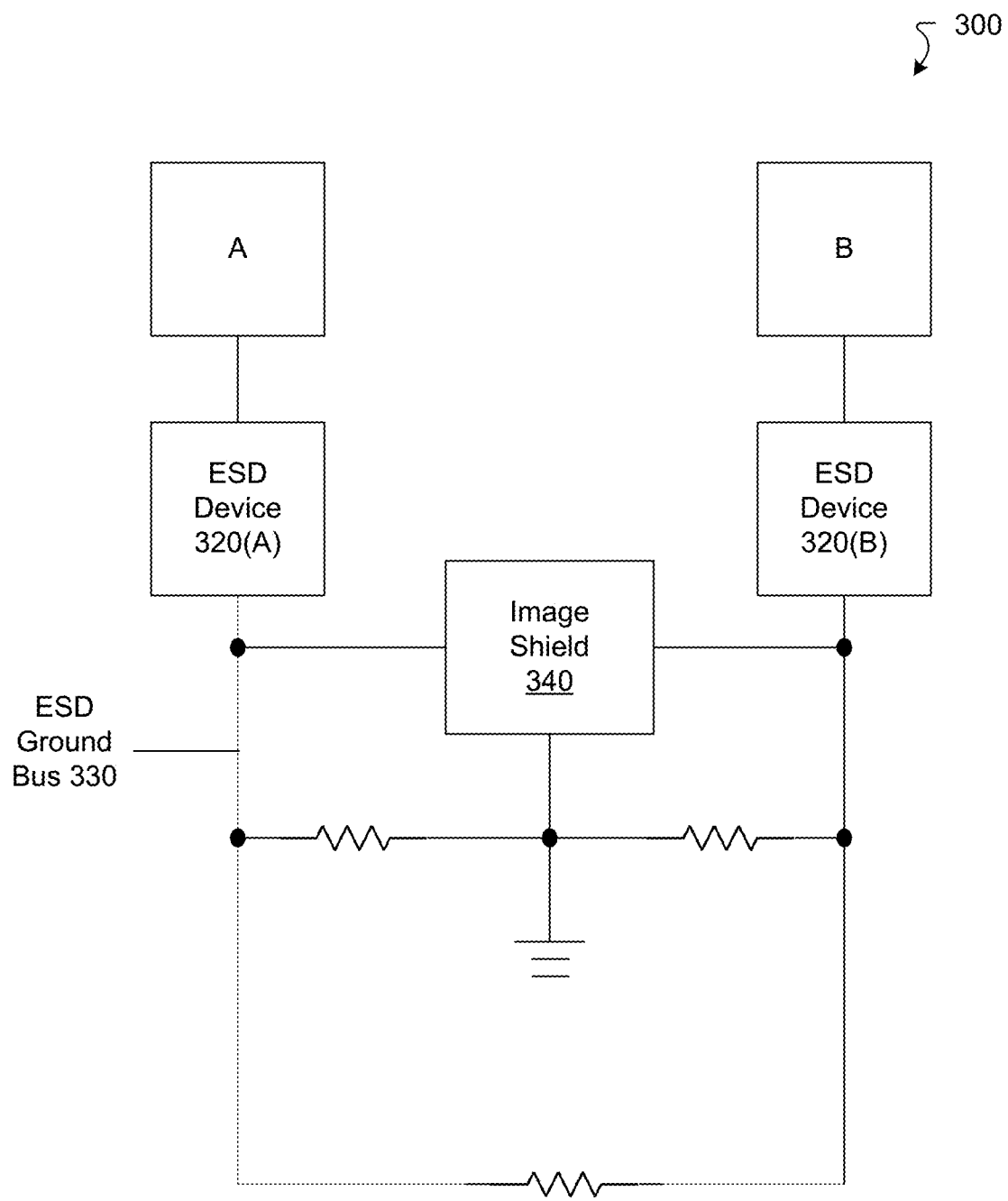
FIG. 3 is a diagram illustrating example ESD devices for shunting ESD current to ground according to the improved techniques described herein.

FIG. 3 is a block diagram illustrating an example ESD shunting circuit 300. The ESD shunting circuit 300 includes bond pads "A" and "B," respective ESD devices 320(A) and 320(B), an ESD ground bus 330, and an image shield 340.

The ESD devices 320(A) and 320(B) are each configured to identify an input current at the respective bond pad "A" and "B" as an ESD current and direct the ESD current safely to ground. For example, an input current at the bond pad "A" may have a power, or voltage, that would allow that current to pass to an image sensor device (for example, image sensor device 232) safely without damage. In this case, the ESD device 320(A) would pass the current along a signal pathway to the image sensor device. Nevertheless, if the input current at the bond pad "A" has a power or voltage that is large and irregular enough that it is likely ESD current, the ESD device 320(A) will direct the input current to the ESD ground bus 330 and the image shield 340.

Because the ESD device 320(A) directs the ESD current along the light shield 340 on its way to ground, essentially none of the ESD current reaches sensitive devices such as the image sensor device. The light shield 340 can have a small enough resistance to accomplish this shunting of the ESD current because of its inherently low resistance.

Figure 4:
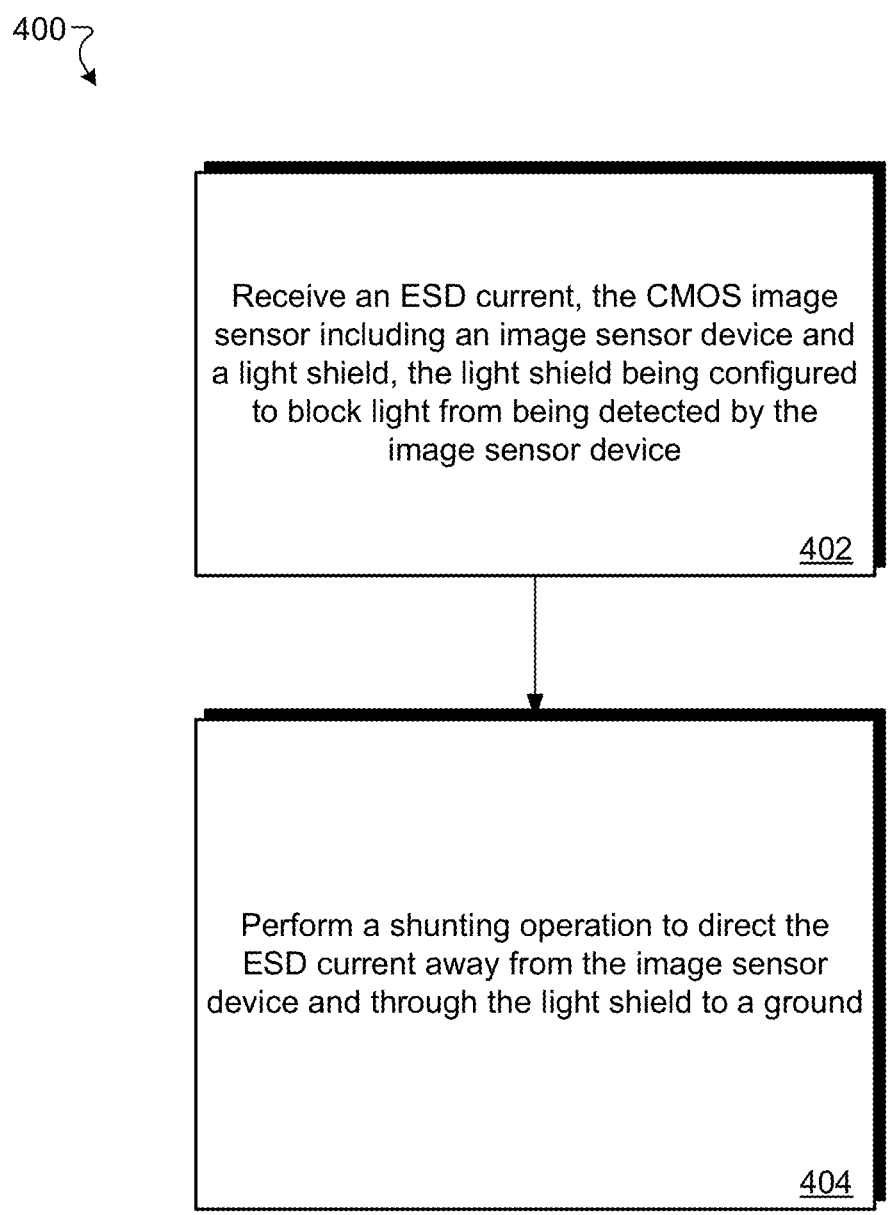
FIG. 4 is a flow chart that illustrates an example method of performing the improved techniques described herein.

FIG. 4 is a flow chart that illustrates an example method 400 of directing ESD current away from an image sensor device.

At 402, an ESD device (e.g., ESD device 320(A)) receives an ESD current. An image sensor that includes the ESD device further includes an image sensor device and a light shield. The light shield is configured to block light from being detected by the image sensor device.

At 404, the ESD device performs a shunting operation to direct the ESD current away from the image sensor device and through the light shield to a ground.

In one general aspect, an apparatus including a substrate; a metal layer disposed on the substrate; a silicon layer disposed on the metal layer, the silicon layer including an image sensor device; an dielectric layer disposed on the metal layer; and a shield layer disposed on the dielectric layer, the shield layer including a light shield and a bond pad, the bond pad having an electrical connection to the metal layer, the light shield being configured to block light from being detected by the image sensor device, the light shield having an electrical connection to the bond pad.

In some implementations, the electrical connection of the bond pad to the metal layer is made using a through-silicon via (TSV). In this case, the electrical connection of the light shield to the bond pad is made at the TSV.

In some implementations, the TSV includes an electrically conductive material. In this case, the TSV is connected to a slotted component in the metal layer. The slotted component includes the same electrically conductive material of the TSV.

In some implementations, the shield layer includes a second bond pad. In this case, the metal layer includes an electrostatic discharge (ESD) ground bus. The ESD ground bus has an electrical resistance between a first ESD device having an electrical connection to the bond pad and a second ESD device having an electrical connection to the second bond pad. Each of the first ESD device and the second ESD device is configured to direct ESD current away from the image sensor device. The light shield includes an electrically conductive material opaque to light at wavelengths the image sensor device is configured to detect. The light shield has an electrical connection to the ESD ground bus. In some implementations, the electrically conductive material of the light shield includes one of aluminum and tungsten.

In some implementations, the electrical connection of the light shield to the ESD ground bus is a parallel electrical connection. In this case, the light shield has an electrical resistance less than 50% of the electrical resistance of the ESD ground bus, in some cases less than 20%.

In another general aspect, an image sensor includes a semiconductor die. The semiconductor die includes an electrostatic discharge (ESD) ground bus configured to direct ESD current away from the image sensor device; an image sensor device; and a light shield configured to block light from the image sensor device at wavelengths the image sensor device is configured to detect, the light shield including an electrically conductive material opaque to light at the wavelengths the image sensor device is configured to detect, the light shield having an electrical connection to the ESD ground bus.

In some implementations, the electrical connection of the light shield to the ESD ground bus is a parallel electrical connection. In this case, the light shield has an electrical resistance less than 50% of the electrical resistance of the ESD ground bus, in some cases less than 20%.

In some implementations, the electrically conductive material of the light shield includes one of aluminum and tungsten.

In some implementations, the semiconductor die further includes a bond pad having an electrical connection to the light shield.

In some implementations, the light shield is included in a shield layer, the shield layer being disposed on a dielectric layer, the dielectric layer being disposed on a metal layer. The electrical connection of the bond pad to the metal layer is made using a through-silicon via (TSV). The electrical connection of the light shield to the bond pad is made at the TSV.

In some implementations, the TSV has a width of between 5 um and 10 um. In some implementations, the TSV includes an electrically conductive material. In this case, the TSV is connected to a slotted component in the metal layer, the slotted component including the same electrically conductive material of the TSV.

In another general aspect, a method includes receiving, by an electrostatic discharge (ESD) device of an image sensor, an ESD current, the image sensor including an image sensor device and a light shield, the light shield being configured to block light peripheral to the die from being detected by the image sensor device. The method also includes performing, by the ESD device, a shunting operation to direct the ESD current away from the image sensor device and through the light shield to a ground.

In some implementations, the ESD current is received from a bond pad of the image sensor. The bond pad has electrical connections to the light shield and the ESD device.

In some implementations, the image sensor includes a semiconductor die. The semiconductor die includes a substrate; a metal layer disposed on the substrate, the metal layer including an electrostatic discharge (ESD) ground bus; a silicon layer disposed on the metal layer, the silicon layer including the image sensor device; an dielectric layer disposed on the metal layer; and a shield layer disposed on the dielectric layer. The shield layer includes the light shield and the bond pad. The bond pad has an electrical connection to the metal layer. The light shield has an electrical connection to the ESD ground bus.

In some implementations, the electrical connection of the light shield to the ESD ground bus is a parallel electrical connection. In this case, the light shield has an electrical resistance less than 50% of the electrical resistance of the ESD ground bus. In some implementations, the light shield has an electrical resistance less than 20% of the electrical resistance of the ESD ground bus.

In some implementations, the electrical connection of the bond pad to the metal layer is made using a through-silicon via (TSV). In this case, the electrical connection of the light shield to the bond pad is made at the TSV.

In some implementations, the TSV includes an electrically conductive material. In this case, the TSV is connected to a slotted component in the metal layer, the slotted component including the same electrically conductive material of the TSV.

A number of embodiments have been described. Nevertheless, it will be understood that various modifications may be made without departing from the spirit and scope of the specification.

It will also be understood that when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

The various apparatus and techniques described herein may be implemented using various semiconductor processing and/or packaging techniques. Some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other embodiments are within the scope of the following claims.

What is claimed is:

1. An apparatus, comprising:
a substrate;
a metal layer disposed on the substrate;
a silicon layer disposed on the metal layer, the silicon layer including an image sensor device;
a dielectric layer disposed on the metal layer;
a shield layer disposed on the dielectric layer and including a light shield; and
a bond pad having an electrical connection to the metal layer, the light shield being configured to block light from being detected by the image sensor device, the light shield having an electrical connection to the bond pad.

2. The apparatus as in claim 1, wherein the electrical connection of the bond pad to the metal layer is made using a through-silicon via (TSV), and
wherein the electrical connection of the light shield to the bond pad is made at the TSV.

3. The apparatus as in claim 2, wherein the TSV includes an electrically conductive material, and
wherein the TSV is connected to a slotted component in the metal layer, the slotted component including the same electrically conductive material of the TSV.

4. The apparatus as in claim 1, wherein the shield layer includes a second bond pad;
wherein the metal layer includes an electrostatic discharge (ESD) ground bus, the ESD ground bus having an electrical resistance between a first ESD device having an electrical connection to the bond pad and a second ESD device having an electrical connection to the second bond pad, each of the first ESD device and the second ESD device being configured to direct ESD current away from the image sensor device, and
wherein the light shield includes an electrically conductive material opaque to light at wavelengths the image sensor device is configured to detect, the light shield having an electrical connection to the ESD ground bus.

5. The apparatus as in claim 4, wherein the electrically conductive material of the light shield includes one of aluminum, copper, and tungsten.

6. The apparatus as in claim 4, wherein the electrical connection of the light shield to the ESD ground bus is a parallel electrical connection, and
wherein the light shield has an electrical resistance, the electrical resistance of the light shield being less than 50% of the electrical resistance of the ESD ground bus.

7. An image sensor, comprising:
a semiconductor die including:
an image sensor device;
an electrostatic discharge (ESD) ground bus configured to direct ESD current away from the image sensor device; and
a light shield configured to block light from the image sensor device at wavelengths the image sensor device is configured to detect, the light shield including an electrically conductive material opaque to light at the wavelengths the image sensor device is configured to detect, the light shield having an electrical connection to the ESD ground bus.

8. The image sensor as in claim 7, wherein the electrical connection of the light shield to the ESD ground bus is a parallel electrical connection, and
wherein the light shield has an electrical resistance, the electrical resistance of the light shield being less than 50% of the electrical resistance of the ESD ground bus.

9. The image sensor as in claim 7, wherein the electrically conductive material of the light shield includes one of aluminum, copper, and tungsten.

10. The image sensor as in claim 7, wherein the semiconductor die further includes a bond pad having an electrical connection to the light shield.

11. The image sensor as in claim 10, wherein the light shield is included in a shield layer, the shield layer being disposed on a dielectric layer, the dielectric layer being disposed on a metal layer,
wherein an electrical connection of the bond pad to the metal layer is made using a through-silicon via (TSV), and
wherein the electrical connection of the light shield to the bond pad is made at the TSV.

12. The image sensor as in claim 10, wherein the TSV includes an electrically conductive material, and
wherein the TSV is connected to a slotted component in the metal layer, the slotted component including the same electrically conductive material of the TSV.

13. The image sensor as in claim 10, wherein the semiconductor die further includes a second bond pad, the second bond pad having no electrical connection to the light shield.

14. A method, comprising:
receiving, by an electrostatic discharge (ESD) device of an image sensor, an ESD current, the image sensor including an image sensor device and a light shield, the light shield being configured to block light from being detected by the image sensor device; and
performing, by the ESD device, a shunting operation to direct the ESD current away from the image sensor device and through the light shield to a ground.

15. The method as in claim 14, wherein the ESD current is received from a bond pad of the image sensor, the bond pad having electrical connections to the light shield and the ESD device.

16. The method as in claim 15, wherein the image sensor includes a semiconductor die, the semiconductor die including:
a substrate;
a metal layer disposed on the substrate, the metal layer including an electrostatic discharge (ESD) ground bus;
a silicon layer disposed on the metal layer, the silicon layer including the image sensor device;
an dielectric layer disposed on the metal layer; and
a shield layer disposed on the dielectric layer, the shield layer including the light shield and the bond pad, the bond pad having an electrical connection to the metal layer, the light shield having an electrical connection to the ESD ground bus.

17. The method as in claim 16, wherein the electrical connection of the light shield to the ESD ground bus is a parallel electrical connection, and
wherein the light shield has an electrical resistance, the electrical resistance of the light shield being less than 50% of the electrical resistance of the ESD ground bus.

18. The method as in claim 16, wherein the shield layer includes a second bond pad, the second bond pad having no electrical connection to the light shield.

* * * * *